United States Patent
Hsu

(10) Patent No.: US 8,749,284 B2
(45) Date of Patent: Jun. 10, 2014

(54) PHASE-LOCKED LOOP SYSTEM

(71) Applicant: Novatek Microelectronics Corp., Hsinchu (TW)

(72) Inventor: Jer-Hao Hsu, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 13/658,091

(22) Filed: Oct. 23, 2012

(65) Prior Publication Data

US 2013/0194012 A1 Aug. 1, 2013

(30) Foreign Application Priority Data

Feb. 1, 2012 (TW) ................................ 101103307

(51) Int. Cl.
*H03L 7/06* (2006.01)

(52) U.S. Cl.
USPC ......................................... 327/157; 327/148

(58) Field of Classification Search
None
See application file for complete search history.

(56) References Cited

U.S. PATENT DOCUMENTS 7,030,688 B2 * 4/2006 Dosho et al. .................. 327/558
2002/0101292 A1 8/2002 Maneatis

* cited by examiner

*Primary Examiner* — Cassandra Cox
(74) *Attorney, Agent, or Firm* — Rabin & Berdo, P.C.

(57) ABSTRACT

A phase-locked loop system is provided. The system includes a charge pump, a voltage-controlled oscillator (VCO) and a bias converter. The charge pump outputs a control voltage according to a phase frequency detection signal, and generates an output current according to a bias signal. The VCO generates an output signal according to the control voltage. The bias converter is coupled between the VCO and the charge pump and for generating the bias signal according to the control voltage.

21 Claims, 5 Drawing Sheets

PHASE-LOCKED LOOP SYSTEM

This application claims the benefit of Taiwan application Serial No. 101103307, filed Feb. 1, 2012, the subject matter of which is incorporated herein by reference.

BACKGROUND OF THE DISCLOSURE

1. Field of the Disclosure

The disclosure relates in general to a phase-locked loop system.

2. Description of the Related Art

Phase-locked loop systems are widely used in analog and digital circuits. Typically, such systems may include a phase frequency detector, a charge pump, and a voltage-controlled oscillator (VCO). In a phase-locked loop system, the VCO is used to generate an output signal whose frequency is gradually close to and ultimately locked on a target frequency that is obtained according to a reference signal of the phase frequency detector. Even the phase-locked loop system has the output signal and the reference signal matched in frequency or phase, noises such as frequency or phase jitter still exist in the output signal. Therefore, it is a subject of the industrial endeavors to provide a phase-locked loop system which can minimize or reduce jitter.

SUMMARY OF THE DISCLOSURE

The disclosure is directed to a phase-locked loop system, which can improve consistency of unit-gain frequency.

According to an aspect of the present disclosure, a phase-locked loop system is provided. The phase-locked loop system includes a charge pump, a voltage-controlled oscillator (VCO), and a bias converter. The charge pump is for outputting a control voltage based on a phase frequency detection signal, and is for generating an output current according to a bias signal. The VCO is for generating an output signal according to the control voltage. The bias converter is coupled between the VCO and the charge pump, and is for generating the bias signal according to the control voltage.

According to another aspect of the present disclosure, a phase-locked loop system is provided. The phase-locked loop system includes a charge pump, a VCO, and a bias converter. The charge pump is for outputting a control voltage based on a phase frequency detection signal, and is for generating an output current according to a bias signal. The VCO is for generating an output signal according to the control voltage. The bias converter is coupled between the VCO and the charge pump. The bias converter includes a first transistor and a current-to-voltage circuit. When biased by the control voltage, the first transistor is for generating a current which is substantially proportional to the control voltage. The current-to-voltage circuit is for receiving the current, and for outputting the bias signal according to the current.

The above and other aspects of the disclosure will become better understood with regard to the following detailed description of the preferred but non-limiting embodiment(s). The following description is made with reference to the accompanying drawings.

DETAILED DESCRIPTION OF THE DISCLOSURE

The phase-locked loop system described in this disclosure can improve consistency of unit-gain frequency when using different multipliers (denoted as N), thus increasing the operation region for frequency division or multiplication.

The disclosure provides a phase-locked loop system. The phase-locked loop system can include a charge pump, a voltage-controlled oscillator (VCO), and a bias converter. The charge pump can output a control voltage based on a phase frequency detection signal, and generate an output current according to a bias signal. The VCO can generate an output signal according to the control voltage. The bias converter can be coupled between the VCO and the charge pump, and can generate the bias signal according to the control voltage.

Figure 1:
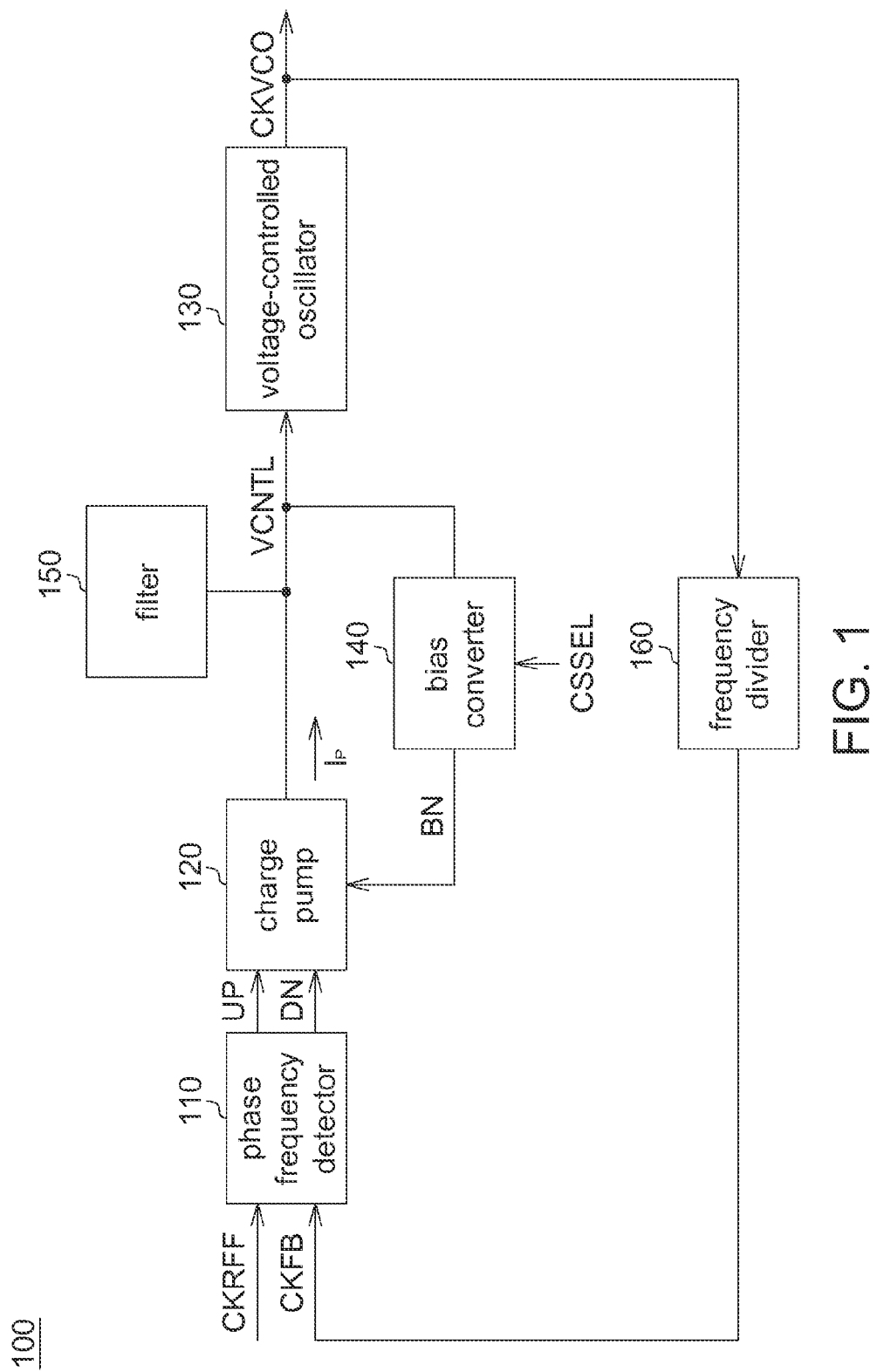
FIG. 1 is a block diagram showing a phase-locked loop system according to an exemplary embodiment of the disclosure.

FIG. 1 is a block diagram showing a phase-locked loop system according to an exemplary embodiment of the disclosure. The phase-locked loop system 100 includes a phase frequency detector 110, a charge pump 120, a VCO 130, a bias converter 140, a filter 150, and a frequency divider 160. The filter 150 is coupled between the charge pump 120 and the VCO 130. The frequency divider 160 is coupled between the VCO 130 and the phase frequency detector 110.

The phase-locked loop system 100 can generate an output signal CKVCO whose frequency is gradually close to and ultimately locked on a target frequency. The target frequency is for example obtained according to a reference signal CKREF of the phase frequency detector 110. For example, the target frequency can be obtained from multiplying the frequency of the reference signal CKREF by a multiplier or a factor denoted as N, which can be expressed as an equation (1) as follows:

$$F(CKVCO)=N \times F(CKREF) \qquad \text{eq. (1)}.$$

The phase frequency detector 110 receives the reference signal CKREF and a feedback signal CKFB, and compares the reference signal CKREF with the feedback signal CKFB, so as to provide a phase frequency detection signal UP/DN to the charge pump 120. The feedback signal CKFB is for example obtained from dividing the frequency of the output signal CKVCO by a divider or a factor denoted as N. The phase frequency detector 110 can detect the difference between the frequency of the output signal CKVCO and the target frequency.

The charge pump 120 outputs a control voltage VCNTL based on the phase frequency detection signal UP/DN, and generates an output current Ip according to a bias signal BN. The output current Ip can be configured as one which is substantially proportional to the control voltage VCNTL, which can be expressed as an equation (2) as follows:

$$VCNTL \propto I_P \qquad \text{eq. (2)}.$$

The VCO 130 generates the output signal CKVCO according to the control voltage VCNTL, and the frequency of the output signal CKVCO is substantially proportional to the control voltage VCNTL, which can be expressed as an equation (3) as follows:

$$F(CKVCO)=K \times VCNTL \qquad \text{eq. (3)},$$

where K is a constant.

The bias converter 140 is coupled between the VCO 130 and the charge pump 120. The bias converter is for generating the bias signal BN according to the control voltage VCNTL. In view of the above-mentioned equations (1)~(3), an equation (4) can be derived therefrom and expressed as follows:

$$F(CKVCO)=N\times F(CKREF)=K\times VCNTL \propto I_P \qquad \text{eq. (4)}.$$

As can be seen from equation (4), the output current Ip is substantially proportional to the multiplier N of the frequency divider 160 in the exemplary embodiment.

An example is made for further illustration as follows. In this example, the filter 150 is exemplified as having a series capacitor Cs, a series resistor R, and a parallel capacitor Cp, while the phase-locked loop system 100 being a third-order phase-locked loop. As such, a unit-gain frequency can be written in equation (5) as follows:

$$\omega_U = \frac{I_P K}{2\pi N} R \frac{C_S}{C_S + C_P} \qquad \text{eq. (5)}$$

As can be observed from equation (5), in this embodiment the output current Ip is configured as one which is substantially proportional to the multiplier N of the frequency divider 160, so that the unit-gain frequency $\omega_U$ can be kept substantially unchanged. In other words, even the value of N is varied, the unit-gain frequency can remain constant, thereby increasing the operation region for frequency division or multiplication or increasing the region of the output frequency. Thus, the phase-locked loop system 100 can have improved stability.

Figure 2A:
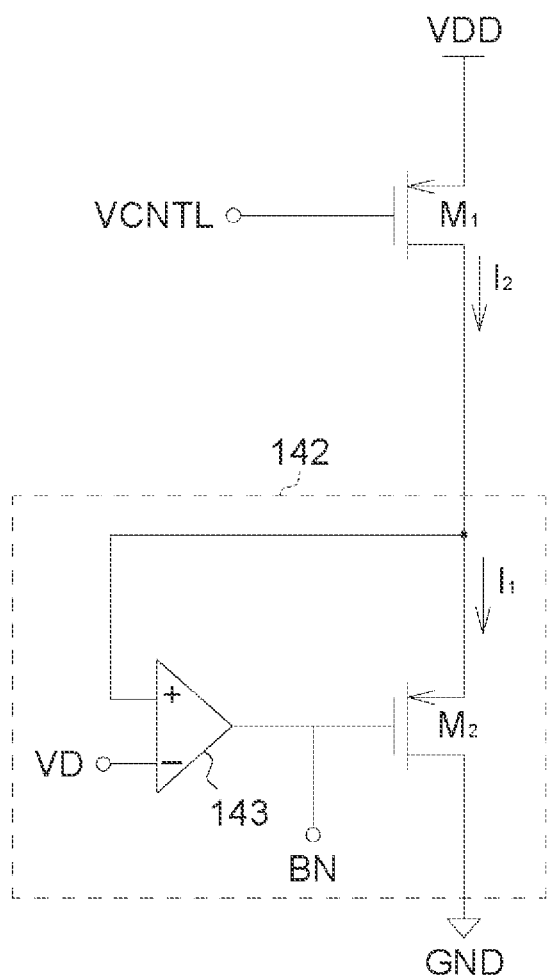
FIG. 2A is a circuit diagram showing a bias converter according to an exemplary embodiment of the disclosure.

Moreover, the bias converter 140 can generate a first current based on the control voltage VCNTL wherein the first current is substantially proportional to the control voltage VCNTL. The bias converter 140 outputs the bias signal BN according to the first current. FIG. 2A is a circuit diagram showing a bias converter according to an exemplary embodiment of the disclosure. In this embodiment, the bias converter 140 includes a first transistor M1 and a current-to-voltage circuit 142. The first transistor M1 can be biased by the control voltage VCNTL to operate in a triode region so as to generate the second current $I_2$ which is substantially proportional to the control voltage VCTNL. The current-to-voltage circuit 142 is for receiving the second current $I_2$, and outputting the bias signal BN according to the second current $I_2$. In other words, in this embodiment the second current $I_2$ is a current component of the first current $I_1$.

FIG. 2A further shows a detailed structure of the current-to-voltage circuit 142 according to an embodiment of the disclosure. As can be seen from FIG. 2A, the current-to-voltage circuit 142 can include a second transistor M2 and an amplifier 143. The second transistor M2 has a first terminal coupled to the first transistor M1 and receiving the second current $I_2$ which is served as the current component of the first current $I_1$. The amplifier 143 has a first input terminal coupled to the first terminal of the second transistor M2, a second input terminal for receiving an input voltage VD, and an output terminal coupled to a control terminal of the second transistor M2 for outputting the bias signal BN according to the first current $I_1$. The bias converter 140 in FIG. 2A can be used to keep constant the frequency of the reference signal CKREF in response to different values of N, so that the frequency of the output signal CKVCO is close to a corresponding target frequency.

Figure 2B:
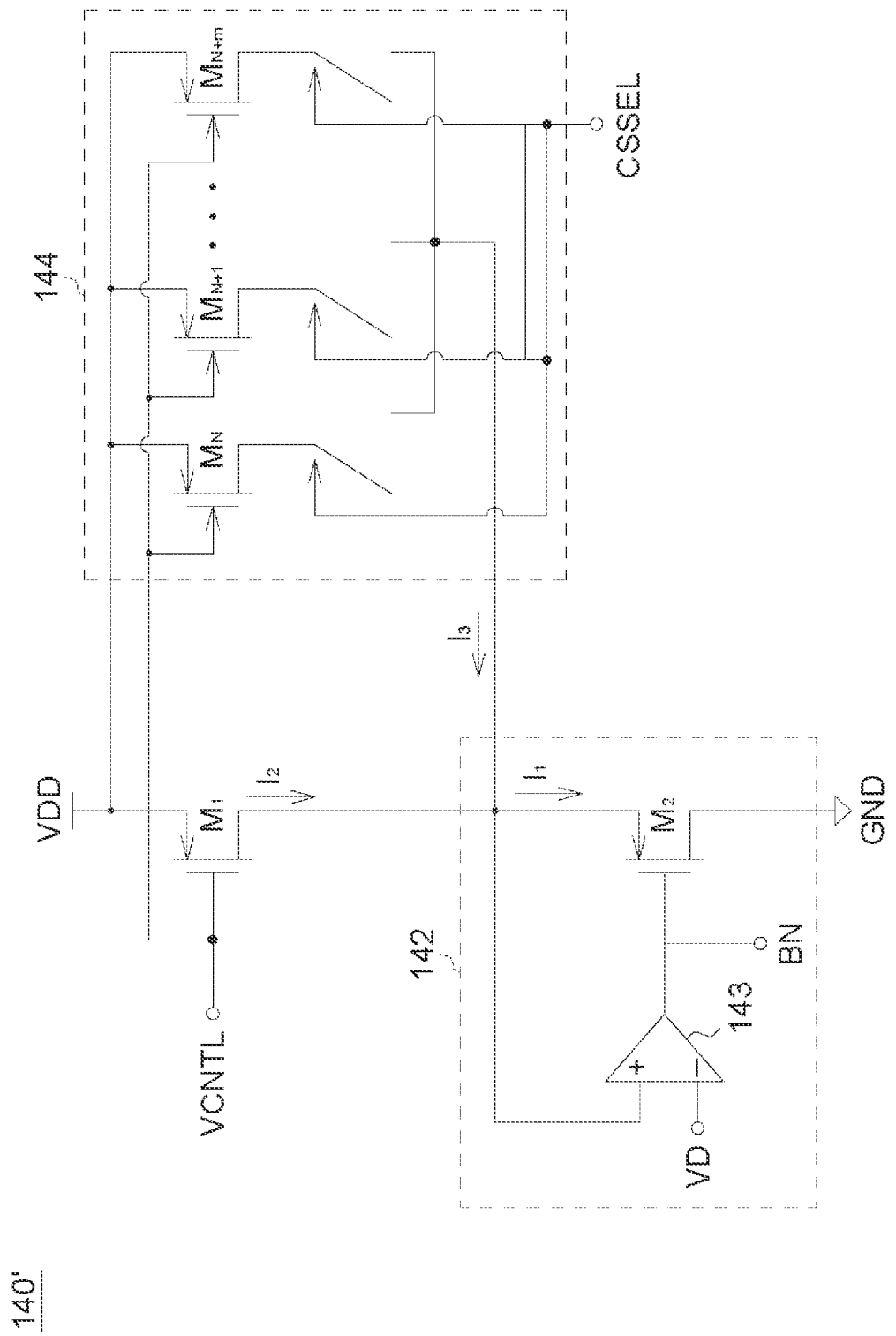
FIG. 2B is a circuit diagram showing a bias converter according to another exemplary embodiment of the disclosure.

FIG. 2B is a circuit diagram showing a bias converter according to another exemplary embodiment of the disclosure. As can be seen from FIG. 2B, the bias converter 140 can further include a current source circuit 144. The current source circuit 144 can be controlled by a selection signal CSSEL. The current source circuit 144 can copy the second current $I_2$ into a third current $I_3$ which is another part of the first current $I_1$. The current source circuit 144 provides the third current $I_3$ to the current-to-voltage circuit 142 so that the current-to-voltage circuit 142 outputs the bias signal BN according to the first current $I_1$ which, at this time, equals to the sum of the second current $I_2$ and the third current $I_3$.

Refer to FIG. 2B for further illustration. The current source circuit 144 can include a number of current mirrors $M_N \sim M_{N+m}$ which are parallelly coupled to the first transistor M1. The current mirrors $M_N \sim M_{N+m}$ are controlled by the reference signal CSSEL to become turned on or off. The current mirrors $M_N \sim M_{N+m}$ is for copying the second current $I_2$ into a third current $I_3$. The current mirrors $M_N \sim M_{N+m}$ provides the current-to-voltage circuit 142 with the third current $I_3$ which is another part of the first current $I_1$.

The selection signal CSSEL indicates a copy ratio between the second current $I_2$ and the third current $I_3$. The copy ratio is for example substantially inversely proportional to the frequency of the reference signal CKREF. An exemplary embodiment is illustrated as follows. When a target frequency is to be used, varying, in response to a reference signal CKREF, the value of N causes the output current Ip to vary according to the value of N. The amplitude of the output current Ip is related to how many current mirrors are turned on. In other words, the number of turned-on ones of the current mirrors can be set to be inversely proportional to the frequency of the reference signal CKREF. For example, when there is a higher frequency of the reference signal CKREF, a smaller value of N can be used, a smaller output current Ip can be provided, and the selection signal CSSEL can indicate a reduced number of turned-on ones of the current mirrors. When there is a lower frequency of the reference signal CKREF, a higher value of N can be used, a higher output current Ip can be provided, and the selection signal CSSEL can indicate an increased number of turned-on ones of the current mirrors. In FIG. 2B, the bias converter 140' can be used in embodiments where the target frequency is fixed and the value of N or the amplitude of the output current Ip is adjusted in response to the frequency of the reference signal CKREF, so as to make the frequency of the output signal CKVCO gradually close to the target frequency. In other words, by establishing an inverse relationship between the output current Ip of the charge pump 120 and the frequency of the input signal CKREF, the phase-locked loop system 100 can provide high stability over a wide input frequency range.

Figure 3:
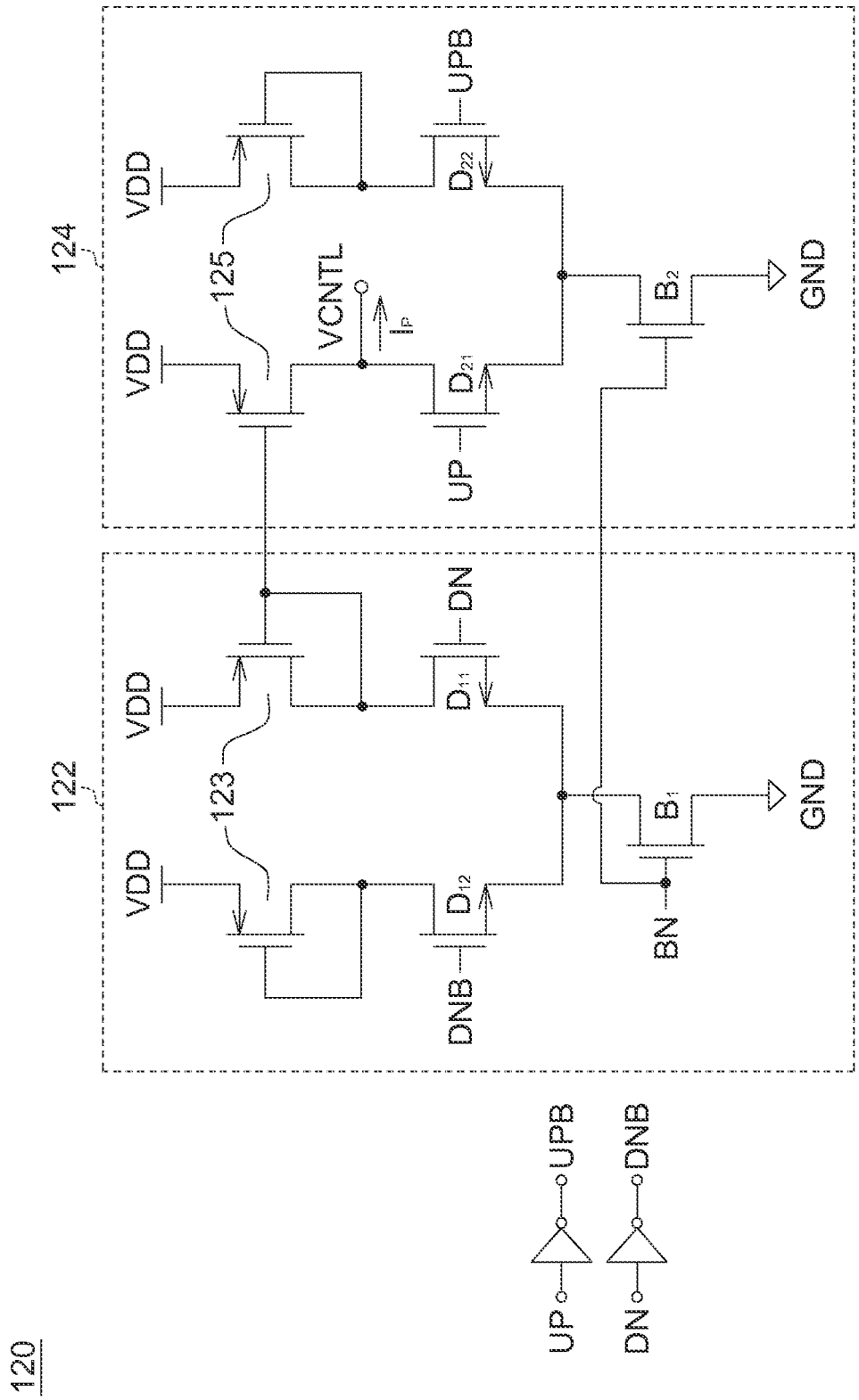
FIG. 3 is a circuit diagram showing a charge pump according to an exemplary embodiment of the disclosure.

As is aforementioned, the bias signal BN is output to the current mirror circuit of the charge pump 120 for copying the first current $I_1$ into the output current $I_p$. FIG. 3 is a circuit diagram showing a charge pump according to an exemplary embodiment of the disclosure. The charge pump 120 includes a first differential bias current source 122 and a second differential bias current source 124. The first differential bias current source 122 is coupled for receiving the bias signal BN and a first signal component DN of the phase frequency detection signal, and for providing a gate control signal. The second differential bias current source 124 is coupled for receiving a second signal component UP of the phase frequency detection signal, the gate control signal, and the bias signal BN, and for providing the control voltage VCNTL and the output current Ip.

The first differential bias current source 122 can include a bias transistor B1, a first differential input pair ($D_{11}, D_{12}$), and a first active load 123. The bias transistor B1 has a gate terminal coupled for receiving the bias signal BN. The first differential input pair ($D_{11}$, $D_{12}$) is coupled to the first bias transistor B1, and is for receiving the first signal component DN and an inverse signal DNB of the first signal component DN. The first active load 123 is coupled to the first differential input pair ($D_{11}$, $D_{12}$), and is for providing the gate control signal. The second differential bias current source 124 can include a second bias transistor B2, a second differential input pair ($D_{21}$, $D_{22}$), and a second active load 125. The second bias transistor B2 has a gate terminal coupled for receiving the bias signal BN. The second differential input pair ($D_{21}$, $D_{22}$) is coupled to the second bias transistor B2, and is for receiving the second signal component UP and an inverse signal UPB of the second signal component UP. The second active load 125 is coupled for receiving the gate control signal, and is for providing the control voltage VCTNL and the output current Ip.

Figure 4:
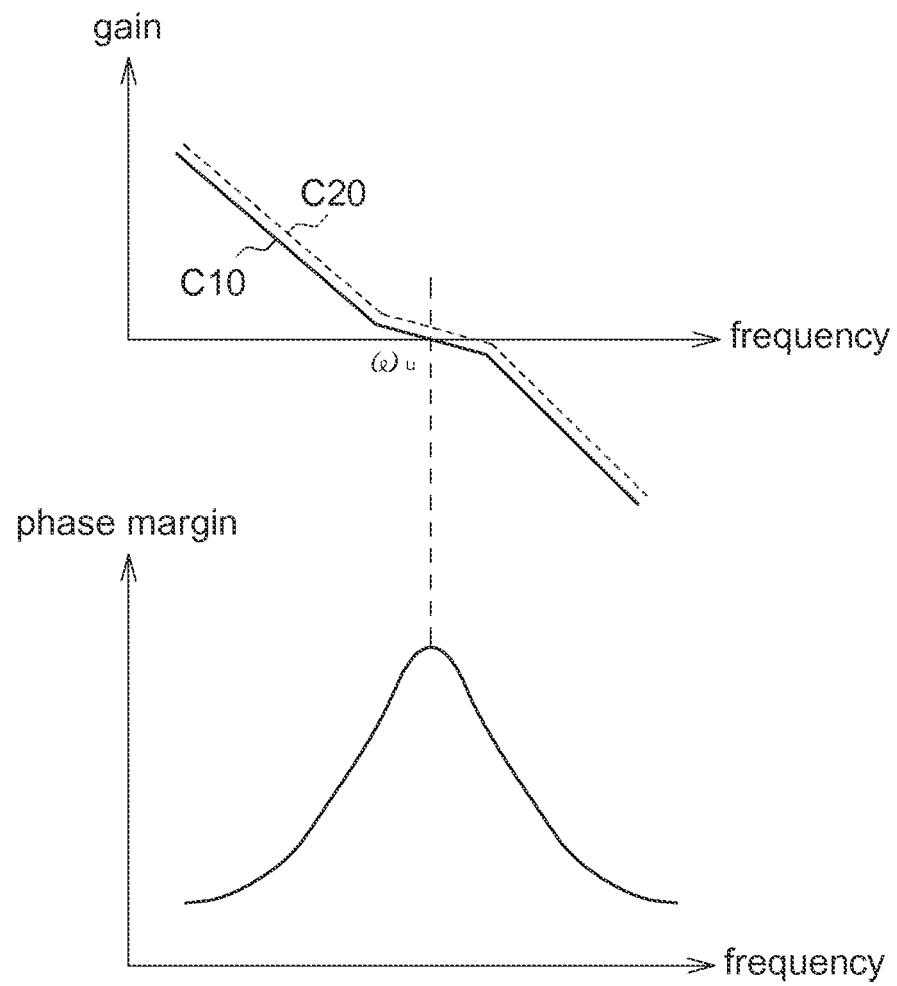
FIG. 4 is a schematic diagram showing the relationship between gain frequency and phase margin.

As such, because the first current $I_1$ is substantially proportional to the control voltage VCNTL, and the output current Ip is obtained from the first current $I_1$, it can be derived that the output current Ip is substantially proportional to the control voltage VCNTL. Besides, the frequency of the output signal CKVCO is substantially proportional to the control voltage VCNTL, so that the frequency of the output current Ip is substantially proportional to the frequency of the output signal CKVCO, which can be seen from the aforementioned equation (4). FIG. 4 is a schematic diagram showing the relationship between gain frequency and phase margin. As to a phase-locked loop system, the unit-gain frequency $\omega_U$ is expected to correspond to the maximum phase margin, which is shown by a curve C10. However, for a conventional phase-locked loop system, varying the value of N causes such curve shifted to a curve C20 where the unit-gain frequency $\omega_U$ fails to correspond to the maximum phase margin. In view of this, in the disclosed embodiment, the bias converter 140 is used to control the output current Ip to be substantially proportional to the value of N. In this way, when the value of N is varied, the output current Ip of the charge pump 120 also is varied according to N, thereby compensating for the variation of N. Thus, the unit-gain frequency $\omega_U$ can be kept substantially unchanged, and correspond to the maximum phase margin, which is shown by the curve C10. Therefore, the phase-lock loop system 100 can have an increased operation region for frequency division or multiplication, or an increased frequency region of the output signal CKVCO.

The circuit topologies of FIGS. 2A, 2B and 3 are merely representative. Various modifications, as suited for the specific environment, without departing from the scope and spirit of several aspects of the present invention, will be apparent to one skilled in the relevant arts by reading the disclosure provided herein. It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the PMOS transistors may be replaced with NMOS (N-type MOS) transistors, while also interchanging the connections to power and ground terminals. In addition, the word "coupled" herein can be realized as a direct connection or an indirect connection in different implementations.

According to the disclosed embodiments of the phase-locked loop system, by allowing the output current of the charge pump to be directly proportional to the value of N, the unit-gain frequency can be kept corresponding to the maximum phase margin. In this way, when different multipliers (denoted as N) are used, the consistency of unit-gain frequency can be improved, thus increasing the operation region for frequency division or multiplication or increasing the region of the output frequency. Besides, by allowing the output current of the charge pump to be substantially inversely proportional to the frequency of the input signal, the phase-locked loop system can provide high stability over a wide input frequency range.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phase-locked loop system comprising
   a charge pump outputting a control voltage based on a phase frequency detection signal, and generating an output current according to a bias signal;
   a voltage-controlled oscillator (VCO) generating an output signal according to the control voltage; and
   a bias converter coupled between the VCO and the charge pump, the bias converter generating the bias signal according to the control voltage;
   wherein the bias converter generates a first current based on the control voltage, the first current is substantially proportional to the control voltage, and the bias converter outputs the bias signal according to the first current.

2. The phase-locked loop system according to claim 1, wherein the output current is substantially proportional to the control voltage.

3. The phase-locked loop system according to claim 1, wherein the bias converter comprises:
   a first transistor responsive to, biase by the control voltage, to generate a second current which is a part of the first current; and
   a current-to-voltage circuit receiving the second current, and outputting the bias signal according to the second current.

4. The phase-locked loop system according to claim 3, wherein the first transistor is biased to operate in a triode region so as to generate the second current which is substantially proportional to the control voltage.

5. The phase-locked loop system according to claim 3, wherein the current-to-voltage circuit comprises:
   a second transistor having a first terminal coupled to the first transistor; and
   an amplifier having a first input terminal coupled to the first terminal of the second transistor, a second input terminal receiving an input voltage, and an output terminal coupled to a control terminal of the second transistor for outputting the bias signal.

6. The phase-locked loop system according to claim 3, wherein the bias converter further comprises:
   a current source circuit controlled by a selection signal, wherein the current source circuit copies the second current into a third current which is another part of the first current, and provides the third current to the current-to-voltage circuit so that the current-to-voltage circuit outputs the bias signal according to the second current and the third current.

7. The phase-locked loop system according to claim 6, wherein the current source circuit comprises a plurality of current mirrors, and the number of turned-on ones of the current minors is determined by the selection signal.

8. The phase-locked loop system according to claim 6, further comprising:
a phase frequency detector receiving a reference signal and a feedback signal, and providing the phase frequency detection signal to the charge pump, wherein the feedback signal is provided according to the output signal, and the selection signal is based on the frequency of the reference signal.

9. The phase-locked loop system according to claim 8, wherein the selection signal indicates a copy ratio between the second current and the third current, and the copy ratio is substantially inversely proportional to the frequency of the reference signal.

10. The phase-locked loop system according to claim 1, further comprising:
a phase frequency detector receiving a reference signal and a feedback signal, and providing a phase frequency detection signal to the charge pump, wherein the feedback signal is provided according to the output signal.

11. The phase-locked loop system according to claim 10, further comprising:
a frequency divider coupled between the VCO and the phase frequency detector.

12. The phase-locked loop system according to claim 1, further comprising:
a filter coupled between the charge pump and the VCO.

13. The phase-locked loop system according to claim 1, wherein the bias converter comprises:
a first transistor having a control terminal receiving the control voltage;
a second transistor having a first terminal coupled to a first terminal of the first transistor; and
an amplifier having a first input terminal coupled to the first terminal of the second transistor, a second input terminal receiving an input voltage, and an output terminal coupled to a control terminal of the second transistor for outputting the bias signal.

14. The phase-locked loop system according to claim 13, wherein the bias converter further comprises:
a plurality of current mirrors parallelly coupled to the first transistor, the current minors controlled by a selection signal to turned on or off.

15. The phase-locked loop system according to claim 14, further comprising:
a phase frequency detector receiving a reference signal and a feedback signal, and providing the phase frequency detection signal to the charge pump, wherein the feedback signal is provided according to the output signal, the selection signal is based on the frequency of the reference signal, and the number of turned-on ones of the current minors is substantially inversely proportional to the frequency of the reference signal.

16. The phase-locked loop system according to claim 1, wherein the charge pump comprises:
a first differential bias current source receiving the bias signal and a first signal component of the phase frequency detection signal, and providing a gate control signal; and
a second differential bias current source receiving a second signal component of the phase frequency detection signal, the gate control signal, and the bias signal, and providing the control voltage and the output current.

17. The phase-locked loop system according to claim 16, wherein the first differential bias current source comprises:
a first bias transistor having a gate terminal receiving the bias signal;
a first differential input pair coupled to the first bias transistor, the first differential input pair receiving the first signal component and an inverse signal of the first signal component; and
a first active load coupled to the first differential input pair for providing the gate control signal.

18. The phase-locked loop system according to claim 16, wherein the second differential bias current source comprises:
a second bias transistor having a gate terminal receiving the bias signal;
a second differential input pair coupled to the second bias transistor, the second differential input pair receiving the second signal component and an inverse signal of the second signal component; and
a second active load receiving the gate control signal, and providing the control voltage and the output current.

19. A phase-locked loop system comprising
a charge pump outputting a control voltage based on a phase frequency detection signal, and generating an output current according to a bias signal
a voltage-controlled oscillator (VCO) generating an output signal according to the control voltage; and
a bias converter coupled between the VCO and the charge pump, the bias converter comprising:
a first transistor, when biased by the control voltage, generating a current which is substantially proportional to the control voltage; and
a current-to-voltage circuit receiving the current, and outputting the bias signal according to the current.

20. The phase-locked loop system according to claim 19, wherein the bias converter further comprises:
a current source circuit controlled by a selection signal, wherein the current source circuit copies the current into another current, and provides the another current to the current-to-voltage circuit so that the current-to-voltage circuit outputs the bias signal according to the another current and the current.

21. The phase-locked loop system according to claim 20, further comprising:
a phase frequency detector receiving a reference signal and a feedback signal, and providing a phase frequency detection signal to the charge pump,
wherein the current source circuit comprises a plurality of current minors, and the number of turned-on ones of the current mirrors is substantially inversely proportional to the frequency of the reference signal.

* * * * *